(12) United States Patent
Bae et al.

(10) Patent No.: US 12,228,617 B2
(45) Date of Patent: Feb. 18, 2025

(54) METHOD FOR DIAGNOSING BATTERY PACK

(71) Applicant: LG ENERGY SOLUTION, LTD., Seoul (KR)

(72) Inventors: Hye Yun Bae, Daejeon (KR); Kyoung Choon Min, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 80 days.

(21) Appl. No.: 18/030,650

(22) PCT Filed: Nov. 19, 2021

(86) PCT No.: PCT/KR2021/017119
§ 371 (c)(1),
(2) Date: Apr. 6, 2023

(87) PCT Pub. No.: WO2022/108399
PCT Pub. Date: May 27, 2022

(65) Prior Publication Data
US 2023/0408594 A1   Dec. 21, 2023

(30) Foreign Application Priority Data
Nov. 23, 2020   (KR) ........................ 10-2020-0158167

(51) Int. Cl.
*G01R 31/30* (2006.01)
*G01J 5/60* (2006.01)
(Continued)

(52) U.S. Cl.
CPC ............ *G01R 31/3865* (2019.01); *G01J 5/60* (2013.01); *G01J 2005/0077* (2013.01)

(58) Field of Classification Search
None
See application file for complete search history.

(56) References Cited

U.S. PATENT DOCUMENTS

| 6,462,551 | B1 * | 10/2002 | Coates .................. | B60L 58/10 320/150 |
| 2009/0167331 | A1 | 7/2009 | Erdmann et al. | |

(Continued)

FOREIGN PATENT DOCUMENTS

| CN | 103579032 A | 2/2014 |
| CN | 107363355 A | 11/2017 |

(Continued)

OTHER PUBLICATIONS

International Search Report (PCT/ISA/210) issued in PCT/KR2021/017119, dated Feb. 28, 2022.

(Continued)

*Primary Examiner* — Jas A Sanghera
(74) *Attorney, Agent, or Firm* — Birch, Stewart, Kolasch & Birch, LLP

(57) ABSTRACT

Discussed is a battery pack diagnosis method including a battery pack manufacturing process, a battery cell charging and discharging process, a battery pack thermal image photographing process, a thermal image reading process, a battery pack magnetic field image photographing process, a magnetic field image reading process, and a wire bonding state defect determining process of finally determining a bonding state of a battery cell and a wire by combining thermal image reading result information obtained in the thermal image reading process and magnetic field image reading result information obtained in the magnetic field image reading process in order to exactly diagnose the bonding state of the battery cell and the wire connecting the battery cell in the battery pack.

10 Claims, 6 Drawing Sheets

(51) Int. Cl.
*G01R 31/385* (2019.01)
*G01J 5/00* (2022.01)

(56) References Cited

U.S. PATENT DOCUMENTS

2013/0041606 A1    2/2013  Tang et al.
2017/0025316 A1    1/2017  Middendorf et al.
2022/0349943 A1*  11/2022  Mima ................ G01R 31/3644

FOREIGN PATENT DOCUMENTS

| DE | 10 2012 024 454 B4 | 5/2019 |
|---|---|---|
| EP | 2 481 517 A2 | 8/2012 |
| EP | 3 382 385 A1 | 10/2018 |
| JP | 5-172772 A | 7/1993 |
| JP | 2000-286314 A | 10/2000 |
| JP | 4584347 B2 | 11/2010 |
| JP | 10-2011-0065064 A | 6/2011 |
| JP | 2013-36975 A | 2/2013 |
| JP | 5229352 B2 | 7/2013 |
| JP | 5246866 B2 | 7/2013 |
| JP | 2017-511000 A | 4/2017 |
| KR | 10-2016-0059803 A | 5/2016 |
| KR | 10-2017-0079580 A | 7/2017 |
| KR | 10-2019-0011096 A | 2/2019 |
| KR | 10-2020-0056715 A | 5/2020 |
| WO | WO 2018/074161 A1 | 4/2018 |
| WO | WO 2020/166840 A1 | 8/2020 |

OTHER PUBLICATIONS

Extended European Search Report for European Application No. 21895166.3, dated Jul. 2, 2024.

\* cited by examiner $T_2 > T_1$

METHOD FOR DIAGNOSING BATTERY PACK

CROSS-REFERENCE TO RELATED APPLICATION

The present application is a National Stage application of PCT Application No. PCT/KR2021/017119 filed on Nov. 19, 2021, which claims priority to Korean Patent Application No. 10-2020-0158167 filed on Nov. 23, 2020 in the Republic of Korea, the entire contents of all these applications being expressly incorporated by reference into the present application.

TECHNICAL FIELD

The present disclosure relates to a battery pack diagnosis method, and more particularly, to a battery pack diagnosis method capable of exactly diagnosing a bonding state between a plurality of battery cells and a plurality of wires connecting the battery cells in a battery pack.

BACKGROUND ART

A battery pack is manufactured by storing a plurality of battery cells in a housing and connecting the plurality of battery cells by using a bus bar and a wire. In the battery pack, a defect may be generated in a bonded portion of the battery cell and the wire.

When the defect is generated in the bonded portion of the battery cell and the wire, the corresponding battery cell may have a great variation in internal resistance while being charged or discharged. For example, the corresponding battery cell has a voltage greater than that of a normal battery cell disposed therearound when charged and has a voltage less than that of a normal battery cell disposed therearound when discharged.

Also, when the corresponding battery cell is continuously charged or discharged, a total output of the battery pack may decrease, and short-circuit may occur in the corresponding battery cell to be ignited. Thus, a bonding state of the bonded portion has to be diagnosed by performing an inspection on the bonding state of the bonded portion of the battery cell and the wire in a battery pack manufacturing process.

However, in one battery pack, several hundreds of battery cells and several hundreds of wires for connecting the battery cells are stored. Thus, the bonding state of the bonded portion of each of the several hundreds of battery cells and wires may not be exactly inspected.

The background technology of the present invention is disclosed in patent documents below.
(Patent document 1) KR10-2019-0011096 A
(Patent document 2) KR10-2020-0056715 A

SUMMARY

The present disclosure provides a battery pack diagnosis method capable of exactly diagnosing a bonding state between a plurality of battery cells and a plurality of wires connecting the battery cells in a battery pack.

In accordance with an exemplary embodiment, a battery pack diagnosis method includes: a battery pack manufacturing process of manufacturing a battery pack by bonding-connecting a battery cell and a wire; a battery cell charging and discharging process of charging and discharging the battery cell through the wire; a battery pack thermal image photographing process of photographing a thermal image of the battery pack; a thermal image reading process of reading a bonding state of a bonded portion of the battery cell and the wire from photographed thermal image data of the thermal image; a battery pack magnetic field image photographing process of photographing a magnetic field image of the battery pack; a magnetic field image reading process of reading the bonding state of the bonded portion of the battery cell and the wire from photographed magnetic field image data of the magnetic field image; and a wire bonding state defect determining process of finally determining the bonding state of the battery cell and the wire by combining thermal image reading result information obtained in the thermal image reading process and magnetic field image reading result information obtained in the magnetic field image reading process.

The battery pack thermal image photographing process may generate the photographed thermal image by photographing a predetermined plane on which the wire is positioned, and the photographed thermal image may have a predetermined pixel size less than at least one of a thickness of the wire and a size of a bonded portion of the wire.

The thermal image reading process may include: a thermal image contour generating process of extracting a predetermined contour in the photographed thermal image and generating a shape of the bonded portion of the battery cell and the wire; a bonded portion temperature reading process of reading a temperature of the bonded portion of the battery cell and the wire from the photographed thermal image data as one of a high temperature and a low temperature; a bonded portion abnormal connection determining process of determining the bonding state of the bonded portion of the battery cell and the wire as an abnormal connection-confirmed state when the bonded portion of the battery cell and the wire has a temperature greater than a predetermined reference temperature; a bonded portion normal connection-considered determining process of determining the bonding state of the bonded portion of the battery cell and the wire as a normal connection-considered state when the bonded portion of the battery cell and the wire has a temperature less than the reference temperature; and a thermal image reading result information generating process of generating the thermal image reading result information by matching position information of the bonded portion of the battery cell and the wire with the bonding state of the bonded portion of the battery cell and the wire.

The battery pack magnetic field image photographing process may generate the magnetic field image by photographing the same predetermined plane as that photographed to obtain the photographed thermal image, and the photographed magnetic field image may have a predetermined pixel size determined in correspondence to that of the photographed thermal image.

The magnetic field image reading process may include: a magnetic field image contour generating process of generating a shape of the bonded portion of the battery cell and the wire in the photographed magnetic field image by using the contour extracted from the thermal image reading process; a bonded portion magnetic field intensity reading process of reading a magnetic field intensity of the bonded portion of the battery cell and the wire from the photographed magnetic field image data; a bonded portion normal connection determining process of determining the bonding state of the bonded portion of the battery cell and the wire as a normal connection-confirmed state when the bonded portion of the battery cell and the wire has the magnetic field intensity greater than a predetermined reference intensity; a bonded portion abnormal connection-considered determining process of determining the bonding state of the bonded portion of the battery cell and the wire as an abnormal connection-considered state when the bonded portion of the battery cell and the wire has the magnetic field intensity less than the reference intensity; and a magnetic field image reading result information generating process of generating magnetic field image reading result information by matching position information of the bonded portion of the battery cell and the wire with the bonding state of the bonded portion of the battery cell and the wire.

The wire bonding state defect determining process may finally determine the bonding state of the bonded portion of the battery cell and the wire as one state selected from a normal connection state, an abnormal connection state, and an abnormal broken state by comparing the thermal image reading result information with the magnetic field image reading result information.

The wire bonding state defect determining process, by comparing the thermal image reading result information with the magnetic image reading result information, may finally determine: the bonding state of the bonded portion of the battery cell and the wire as the abnormal connection state when the bonding state of the bonded portion of the battery cell and the wire is an abnormal connection-confirmed state; the bonding state of the bonded portion of the battery cell and the wire as the normal connection state when the bonding state of the bonded portion of the battery cell and the wire is a normal connection-confirmed state; and the bonding state of the bonded portion of the battery cell and the wire as the abnormal broken state when the bonding state of the bonded portion of the battery cell and the wire is a normal connection-considered state or an abnormal connection-considered state.

While the battery cell charging and discharging process is performed, the battery pack thermal image photographing process and the battery pack magnetic field image photographing process may be simultaneously performed.

While the battery cell charging and discharging process is performed, the battery pack thermal image photographing process and the battery pack magnetic field image photographing process may be performed in a predetermined order with a predetermined time difference.

In accordance with the exemplary embodiment, the bonding state between the battery cell and the wire connected thereto in the battery pack may be exactly diagnosed by combining the thermal image reading result of the battery pack with the magnetic field image reading result of the battery pack. Thus, the wire having the defective bonding state may not be left out from the diagnosis result. That is, the bonding state may be exactly diagnosed in comparison with the case of reading only the thermal image or the case of reading only the magnetic field image.

DETAILED DESCRIPTION OF EMBODIMENTS

Figure 1:
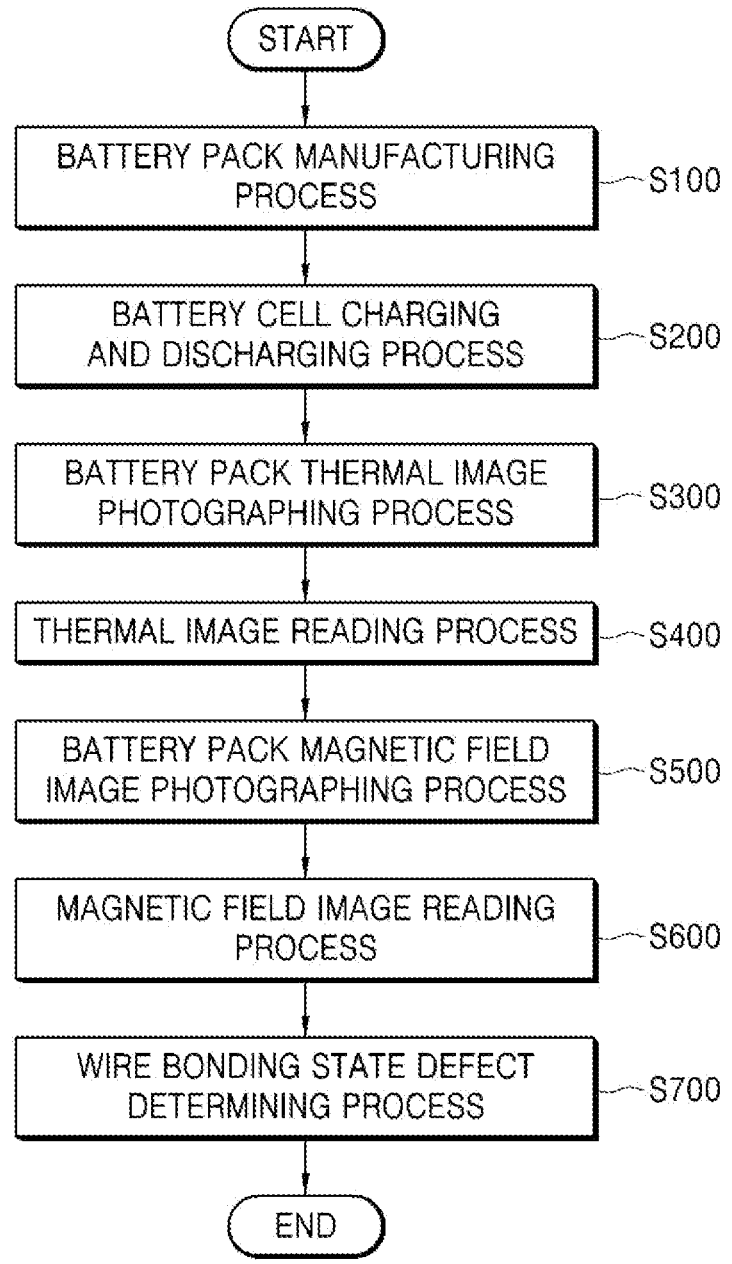
FIG. 1 is a flowchart representing a battery pack diagnosis method in accordance with an exemplary embodiment.

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

Hereinafter, exemplary embodiments will be described in detail with reference to the accompanying drawings.

1. Battery Pack Diagnosis Method in Accordance with an Exemplary Embodiment

FIG. 1 is a flowchart representing a battery pack diagnosis method in accordance with an exemplary embodiment.

As illustrated in FIG. 1, the battery pack diagnosis method in accordance with an exemplary embodiment includes a battery pack manufacturing process S100, a battery cell charging and discharging process S200, a battery pack thermal image photographing process S300, a thermal image reading process S400, a battery pack magnetic field image photographing process S500, a magnetic field image reading process S600, and a wire bonding state defect determining process S700.

1.1. Battery Pack Manufacturing Process S100

Figure 2:
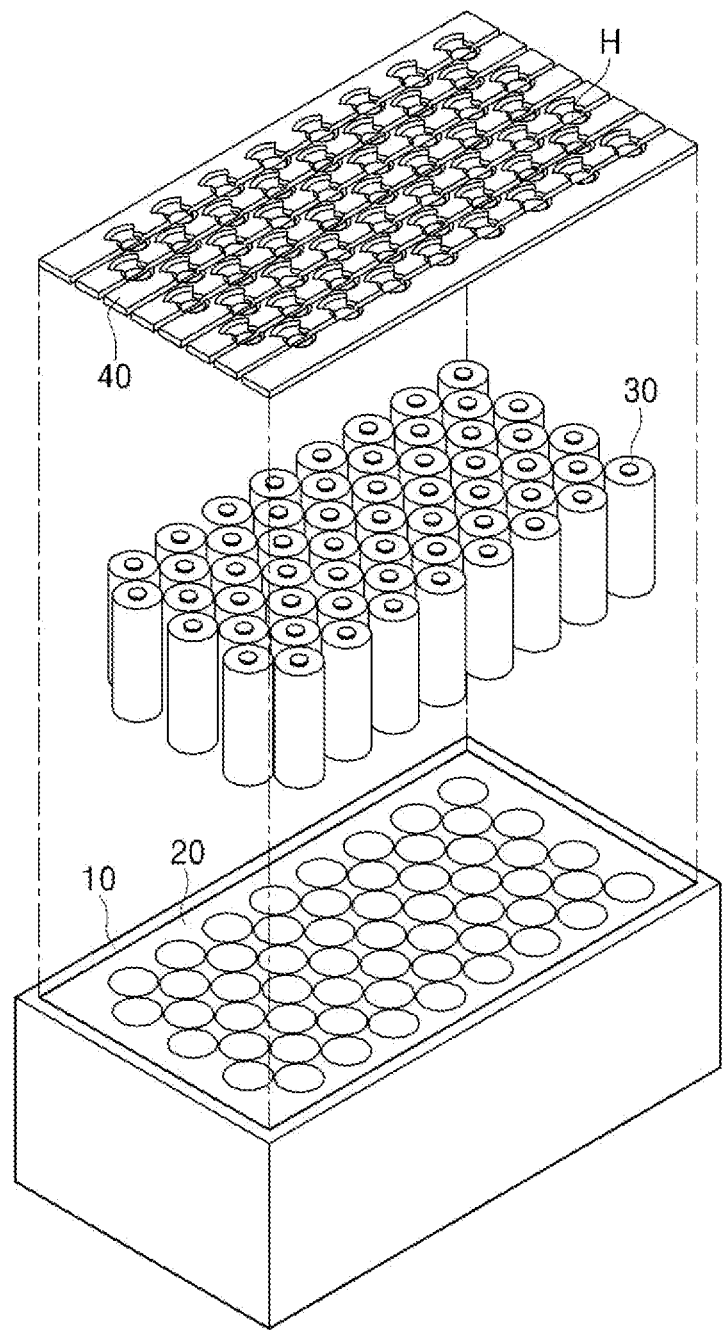
FIGS. 2 and 3 are schematic views exemplarily illustrating a battery pack manufacturing process in accordance with an exemplary embodiment.
Figure 3:
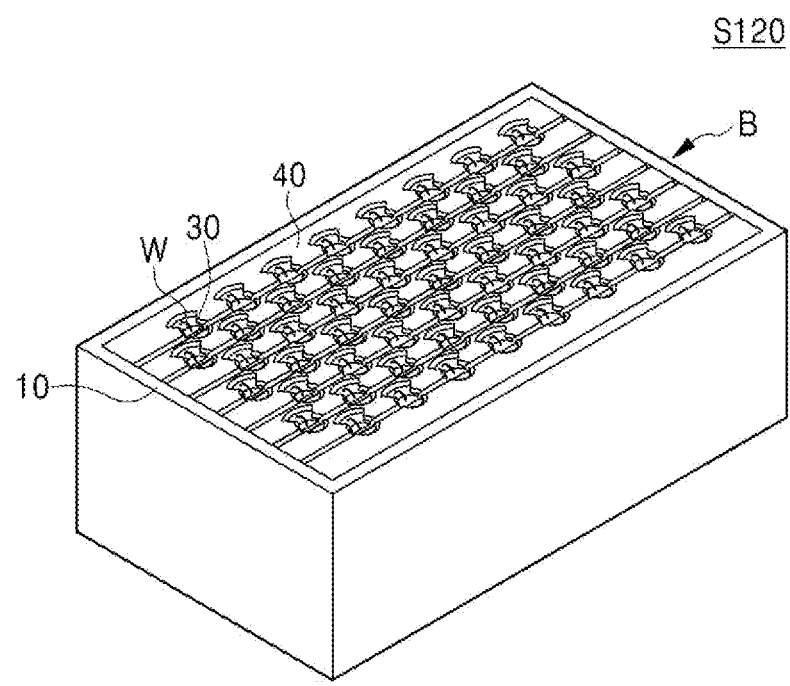

FIGS. 2 and 3 are schematic views exemplarily illustrating a battery pack manufacturing process in accordance with an exemplary embodiment.

The process of manufacturing the battery pack manufactures a battery pack B by connecting a battery cell 30 and a wire W through bonding. The process of manufacturing the battery pack may include a battery cell storing process S110 and a wire bonding process S120.

1.1.1. Battery Cell Storing Process S110

Referring to FIG. 2, in the battery cell storing process, a battery pack housing 10, a battery cell holder 20, a plurality of battery cells 30, and a bus bar 40 are prepared. Thereafter, the battery cell holder 20 may be stored in the battery pack housing 10, and the plurality of battery cells 30 may be stored in the battery cell holder 20. Also, the bus bar 40 may be seated on the plurality of battery cells 30.

Here, the battery pack housing 10 may have a rectangular container shape of which the inside is opened upward. Alternatively, the battery pack housing 10 may have various shapes. The battery cell holder 20 may be made of various materials and various shapes capable of fixing the plurality of battery cells 30. The battery cell 30 may be a cylindrical secondary battery cell extending in a vertical direction. Alternatively, the battery cell 30 may be a can-type secondary battery cell extending in a vertical direction. The battery cells 30 may be arranged in a horizontal direction to form a predetermined arrangement.

1.1.2. Wire Bonding Process S120

Referring to FIG. 3, a wire bonding process may manufacture a battery pack B such that a plurality of wires W are respectively arranged in a plurality of through-holes H defined in the bus bar 40 to connect the plurality of battery cells 30 and the bus bar 40, and then, by performing a wire bonding, one end of each of the plurality of wires W is connected to each of the plurality of battery cells 30, and the other end of each of the plurality of wires W is connected to the bus bar 40.

Here, as a bonded portion of the battery cell 30 and the wire W is damaged, the one end of the wire W may not normally contact the battery cell 30. Thus, the bonded portion may have an abnormally small area. Also, the bonded portion may be completely broken.

Alternatively, a bonded portion of the bus bar 40 and the other end of the wire W may be damaged, and the bonded portion may be completely broken. Even in this case, a bonding state of the bonded portion may be determined by the same method through processes below.

1.2. Battery Cell Charging and Discharging Process S200

Figure 4:
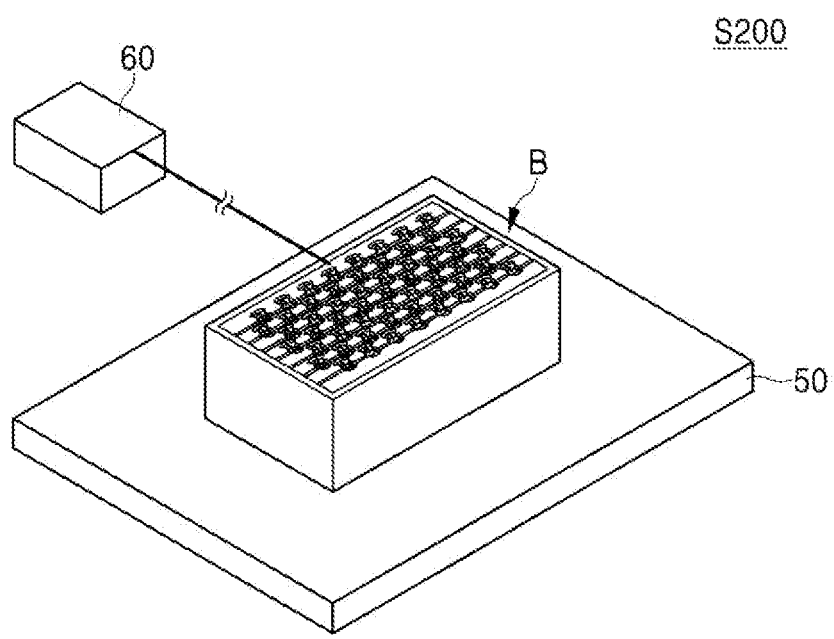
FIG. 4 is a schematic view exemplarily illustrating a battery cell charging and discharging process in accordance with an exemplary embodiment.

FIG. 4 is a schematic view exemplarily illustrating the battery cell charging and discharging process in accordance with an exemplary embodiment.

Referring to FIG. 4, the battery cell charging and discharging process charges and discharges the battery cell through the wire. The battery cell charging and discharging process may include a process of seating the manufactured battery pack B on a support part 50, a process of connecting a charge and discharge unit 60 to an input and output terminal (not shown) of the battery pack B, which is connected with the battery cell 30 through the wire W, and a process of charging or discharging the battery cell 30 in the battery pack B by using the charge and discharge unit 60.

Here, the charge and discharge unit 60 may include a predetermined charge source (not shown) and a predetermined discharge rod (not shown). While the battery cell 30 is charged or discharged by using the charge and discharge unit 60, a current flow passing the input and output terminal, the wire W, and the battery cell 30 is formed. Here, when the bonded portion of the battery cell 30 and the wire W is damaged, an abnormal current flow may be formed, or a current flow may not be formed.

For example, when the bonded portion has an abnormally small area as the bonded portion of the battery cell 30 and the wire W is damaged, resistance of the bonded portion may increase, and an abnormal current flow may be formed. In this case, the bonded portion may have a temperature greater than that of a surrounding portion thereof while a current flows through the bonded portion.

Also, when the bonded portion of the battery cell 30 and the wire W is completely broken, a current flow may not be formed.

When the bonded portion of the battery cell 30 and the wire W is not damaged, or when the bonded portion of the battery cell 30 and the wire W is completely broken, the bonded portion may have a temperature less than that of the damaged bonded portion.

Also, when the bonded portion of the battery cell 30 and the wire W is damaged or completely broken, a current intensity of the bonded portion may be less than a surrounding portion thereof or have a value of 0, and a magnetic field intensity of the bonded portion may be less than that of a surrounding portion thereof.

When the bonded portion of the battery cell 30 and the wire W is not damaged, while a current flows through the bonded portion, a current intensity of the bonded portion may be greater than that of the above case, and thus a magnetic field intensity may be also greater than that of the above case.

1.3. Battery Pack Thermal Image Photographing Process S300

Figure 5:
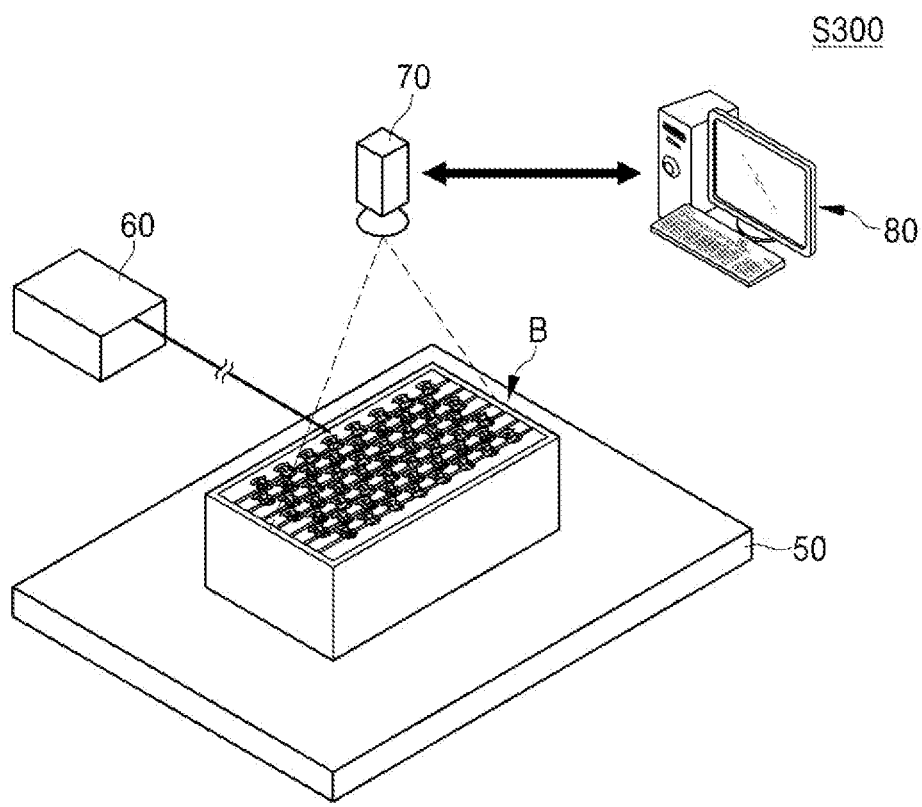
FIG. 5 is a schematic view exemplarily illustrating a battery pack thermal image photographing process in accordance with an exemplary embodiment.

FIG. 5 is a schematic view exemplarily illustrating the battery pack thermal image photographing process in accordance with an exemplary embodiment.

The battery pack thermal image photographing process photographs a thermal image of the battery pack B. The battery pack thermal image photographing process may include a process of seating the battery pack B on the support part 50 and arranging a thermal image photographing unit 70 above the support part 50 and a process of photographing a thermal image of a predetermined plane on which the wire W is disposed, e.g., a top surface of the battery pack B, by using the thermal image photographing unit 70.

For example, the battery pack B may be seated on the support part 50 having a top surface capable of supporting the battery pack B, and then the thermal image photographing unit 70 connected with a diagnosis part 80 may be moved above the battery pack B. Also, an infrared ray emitted from the top surface of the battery pack B may be detected by using a plurality of detection elements (not shown) forming a predetermined focal plane arrangement of a focal plane of the thermal image photographing unit 70, and a thermal image of the top surface of the battery pack B may be photographed.

Here, the photographed thermal image may have a predetermined pixel size that is determined in correspondence to a size of the wire W. For example, the photographed thermal image may have a predetermined pixel size less than at least one of a thickness of the wire W and a size of a bonded portion of the wire W to distinguish the wire W in the photographed thermal image.

Alternatively, the photographed thermal image may have a predetermined pixel size less than a diameter of the battery cell 30.

1.4. Thermal Image Reading Process S400

Figure 6:
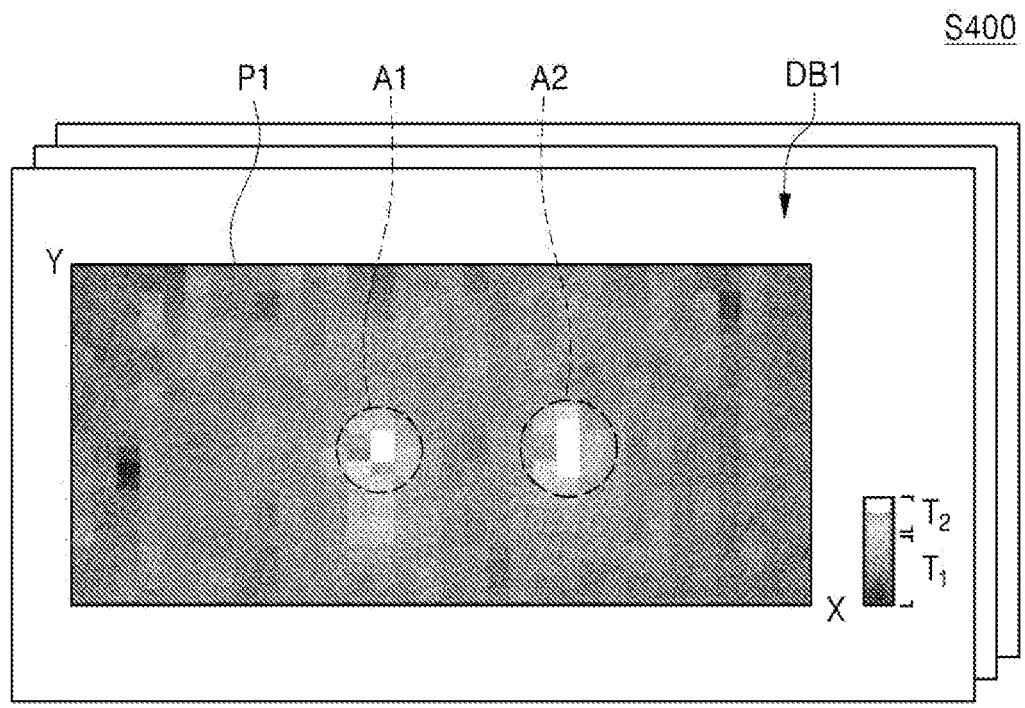
FIG. 6 is a conceptual view for explaining a thermal image reading process in accordance with an exemplary embodiment.

FIG. 6 is a conceptual view for explaining the thermal image reading process in accordance with an exemplary embodiment.

The thermal image reading process reads a bonding state of the bonded portion of the battery cell 30 and the wire W from photographed thermal image data DB1. This process may be performed in the diagnosis part 80.

Here, the thermal image reading process may include: a thermal image contour generating process of extracting a predetermined contour in the photographed thermal image and generating a shape of the bonded portion of the battery cell 30 and the wire W; a bonded portion temperature reading process of reading a temperature of the bonded portion of the battery cell 30 and the wire W from the photographed thermal image data DB1 as one of a high temperature and a low temperature; a bonded portion abnormal connection determining process of determining a bonding state of the bonded portion as an abnormal connection-confirmed state when the bonded portion of the battery cell and the wire has a high temperature; a bonded portion normal connection-considered determining process of determining a bonding state of the bonded portion as a normal connection-considered state when the bonded portion of the battery cell and the wire has a low temperature; and a thermal image reading result information generating process of generating the thermal image reading result information by matching position information of the bonded portion with the bonding state of the bonded portion.

More specifically, a predetermined contour is extracted from the photographed thermal image. For example, predetermined heat is generated from each of the battery cell 30, the bus bar 40, and the wire W and transferred to a surrounding area while the battery cell 30 is charged and discharged. Here, each of the battery cell 30, the bus bar 40, and the wire W may have a different predetermined size, material, and property, and when thermal images of the battery cell 30, the bus bar 40, and the wire W are reviewed by photographing the same, a minute temperature difference may be generated at a boundary therebetween, and a contour caused by the temperature difference may be generated.

Thus, a shape of the bonded portion of the battery cell 30 and the wire W may be generated by extracting a predetermined contour from the photographed thermal image, and through this, pixels corresponding to the bonded portion of the wire W may be distinguished from pixels that are not. Thus, the bonded portion of the wire W in the photographed thermal image may be known.

Thereafter, pixels of a photographed thermal image P1 are divided based on temperatures. That is, the pixels of the photographed thermal image P1 is divided into a pixel A1 and A2 having a high temperature $T_2$ greater than a predetermined reference temperature and a pixel having a low temperature $T_1$ less than the reference temperature. Each of the high temperature $T_2$ and the low temperature $T_1$ may have a predetermined temperature range. For example, the low temperature $T_1$ less than the reference temperature may have a predetermined temperature range, and the high temperature $T_2$ may have a predetermined temperature range greater than that of the low temperature $T_1$.

For example, the reference temperature may be within a range of a surface temperature of the wire W when the battery cell 30 is charged or discharged in a state in which the bus bar 40, the wire W, and the battery cell 30 are normally wire-bonded and connected. Here, the surface temperature may be obtained by a theoretical calculation or a predetermined experiment of repeatedly measuring a temperature of the wire W connected with the battery cell 30 while the battery cell 30 is charged or discharged under the room temperature or the standard temperature.

Thereafter, the pixel A1 and A2 having the high temperature $T_2$ is distinguished from the pixel having the low temperature, and a closed curve (not shown) is formed to surround the pixel A1 and A2 having the high temperature $T_2$. Thereafter, whether the wire W is positioned inside the closed curve is checked. That is, whether the contour extracted from the thermal image P1 to distinguish the pixels corresponding to the bonded portion of the wire W from the pixels that are not overlaps the closed curve surrounding the pixels A1 and A2 having the high temperature $T_2$ may be checked, and then, when the contour overlaps the closed curve, whether the wire W is positioned inside the closed curve may be checked.

Thereafter, position information of the bonded portion of the wire W positioned inside the closed curve is obtained. For example, the position information of the bonded portion of the wire W positioned inside the closed curve may be obtained in the form of a predetermined coordinate by using an installation height, an installation angle, a view angle, and a resolution X-Y of the thermal image photographing unit 70 and a height and an area of the top surface of the battery pack B. In the same manner, position information of the bonded portion of the wire W positioned outside the closed curve may be obtained.

Thereafter, the bonded portion of the wire W positioned inside the closed curve is determined as the abnormal connection-confirmed state. Also, the bonded portion of the wire W positioned outside the closed curve is determined as the normal connection-considered state.

1.5. Battery Pack Magnetic Field Image Photographing Process S500

Figure 7:
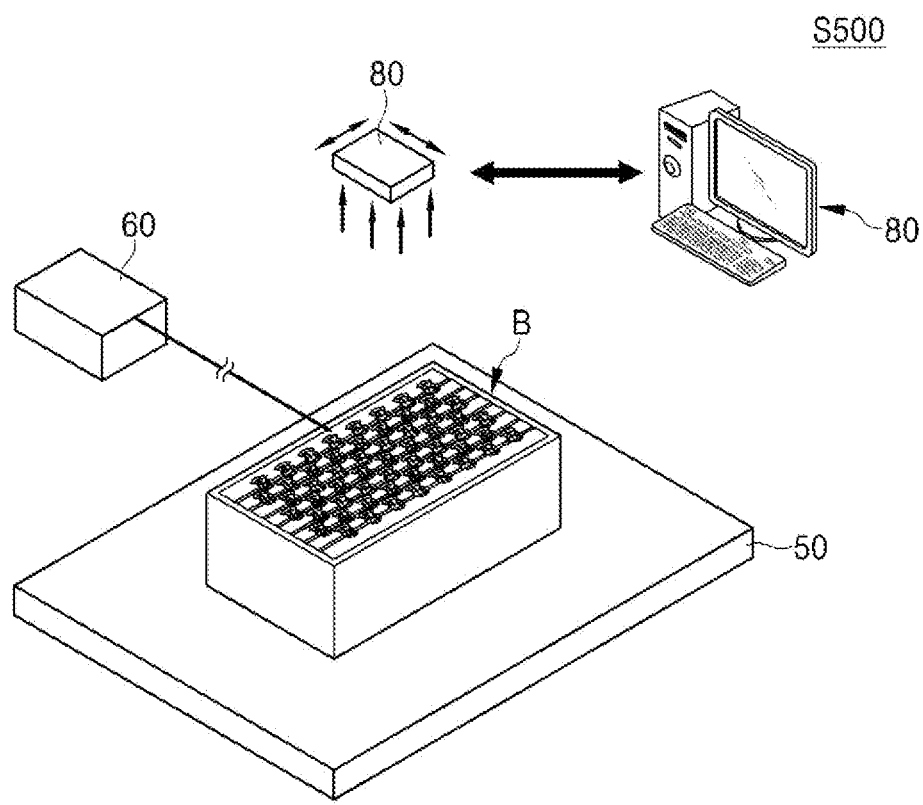
FIG. 7 is a schematic view exemplarily illustrating a battery pack magnetic field image photographing process in accordance with an exemplary embodiment.

FIG. 7 is a schematic view exemplarily illustrating the battery pack magnetic field image photographing process in accordance with an exemplary embodiment.

Referring to FIG. 7, the battery pack magnetic field image photographing process photographs a magnetic field image of the battery pack B.

When a current and a magnetic field are simultaneously applied to a target, a magnetized state of the target may form a specific angle, and through this angle, a size of the magnetic field generating a current may be measured. Also, reflected light generated as a laser beam is incident to the target may be collected to detect an intensity thereof, and an intensity of the magnetic field may be calculated based on the detected intensity of the reflected light. Besides, the intensity of the magnetic field may be obtained by using all sorts of magnetic sensors, and from this, a magnetic field image may be generated.

For example, the magnetic field image of the battery pack B may be photographed by using a magnetic field image photographing unit 80 including a predetermined magnetic sensor arrangement. The battery pack magnetic field image photographing process may include a process of positioning the magnetic field image photographing unit 80 above the support part 50 and a process of photographing a magnetic field image of a predetermined plane on which the wire W is positioned by using the magnetic field image photographing unit 80.

For example, the magnetic field image photographing unit 80 may be positioned on the top surface of the battery pack B, and then a magnetic field image of the top surface of the battery pack B may be photographed while scanning the top surface of the battery pack B in a horizontal direction. That is, the magnetic field image is generated by photographing the same predetermined plane as that photographed to obtain the thermal image. Here, the photographed magnetic field image may have a predetermined pixel size that is determined in correspondence to the pixel size of the photographed thermal image. Specifically, the magnetic field image may have the same pixel size as that of the thermal image.

The battery pack thermal image photographing process and the battery pack magnetic field image photographing process, which are described above, may be performed while the battery cell charging and discharging process is performed, and here, the two processes may be simultaneously performed. Thus, the thermal image and the magnetic field image may have the same photographed area and the same photographed time. Alternatively, the battery pack thermal image photographing process and the battery pack magnetic field image photographing process may be performed in a predetermined order with a predetermined time difference.

1.6. Magnetic Field Image Reading Process S600

Figure 8:
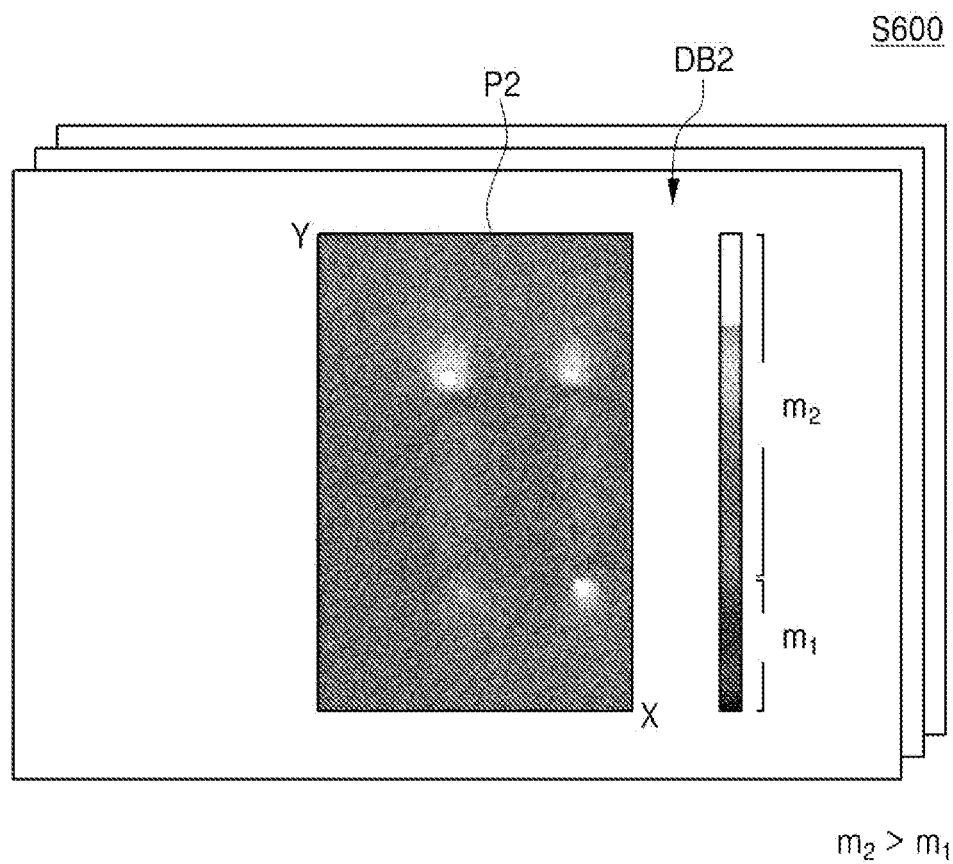
FIG. 8 is a conceptual view for explaining a magnetic field image reading process in accordance with an exemplary embodiment.

FIG. 8 is a conceptual view for explaining the magnetic field image reading process in accordance with an exemplary embodiment.

Referring to FIG. 8, the magnetic field image reading process may read the bonding state of the bonded portion of the battery cell and the wire from photographed magnetic field image data DB2 and be performed by the diagnosis part 80.

The magnetic field image reading process may include: a magnetic field image contour generating process of generating a shape of the bonded portion of the battery cell 30 and the wire W in the photographed magnetic field image by using the contour extracted from the thermal image reading process; a bonded portion magnetic field intensity reading process of reading the magnetic field intensity of the bonded portion of the battery cell and the wire from the photographed magnetic field image data DB2; a bonded portion normal connection determining process of determining the bonding state of the bonded portion as a normal connection-confirmed state when the bonded portion of the battery cell and the wire has a magnetic field intensity greater than a predetermined reference intensity; a bonded portion abnormal connection-considered determining process of determining the bonding state of the bonded portion as an abnormal connection-considered state when the bonded portion of the battery cell and the wire has a magnetic field intensity less than the reference intensity; and a magnetic field image reading result information generating process of generating the magnetic field image reading result information by matching position information of the bonded portion with the bonding state of the bonded portion.

That is, pixels of a magnetic field image P2 photographed with a predetermined resolution X-Y may be distinguished by different colors or brightness according to magnetic field intensities, and distinguished into a pixel having a magnetic field intensity corresponding to an intensity m2 in a predetermined range greater than the reference intensity and a pixel having a magnetic field intensity corresponding to an intensity m1 in a predetermined range less than the reference intensity. Thus, by using the contour extracted from the thermal image reading process, a shape of the bonded portion of the battery cell 30 and the wire W is generated in the photographed magnetic field image P2, a closed curve (not shown) surrounding the pixels having a magnetic field intensity greater than the reference intensity is generated, whether the bonded portion of the wire W is positioned inside the closed curve is checked, and position information of the wire W inside the closed curve and position information of the wire W outside the closed curve are obtained. The magnetic field intensity has a unit of micro-Tesla (μTesla). The reference intensity may be within a range of a magnetic field intensity measured from the wire W while the battery cell 30 is charged or discharged in a state in which the bus bar 40, the wire W, and the battery cell 30 are normally wire-bonded and connected. Here, the reference intensity may be obtained by a theoretical calculation or a predetermined experiment of repeatedly measuring a magnetic field intensity generated from the wire W connected with the battery cell 30 while the battery cell 30 is charged or discharged under the room temperature or the standard temperature.

Thereafter, the bonded portion of the wire W positioned inside the closed curve is determined as the normal connection-confirmed state, and the rest is determined as the abnormal connection-considered state.

1.7. Wire Bonding State Defect Determining Process S700

The wire bonding state defect determining process is performed in the diagnosis part 80 and finally determines the bonding state of the bonded portion of the battery cell and the wire by combining the thermal image reading result information obtained in the thermal image reading process and the magnetic field image reading result information obtained in the magnetic field image reading process.

Specifically, the wire bonding state defect determining process may finally determine the bonding state of the bonded portion of the battery cell and the wire as one state selected from the normal connection state, the abnormal connection state, and the abnormal broken state by comparing the thermal image reading result information with the magnetic field image reading result information.

That is, when the bonding state of the bonded portion of the battery cell and the wire is the abnormal connection-confirmed state by comparing the thermal image reading result information with the magnetic field image reading result information, the bonding state of the bonded portion may be finally determined as the abnormal connection state.

For example, the feature in which the bonding state of the bonded portion of the battery cell and the wire is the abnormal connection-confirmed state represents that the bonded portion has a high temperature. That is, when the bonded portion has the high temperature, the bonding state of the bonded portion is finally determined as the abnormal connection state regardless of the magnetic field image reading result.

Also, when the bonding state of the bonded portion of the battery cell and the wire is the normal connection-confirmed state by comparing the thermal image reading result information with the magnetic field image reading result information, the bonding state of the bonded portion may be finally determined as the normal connection state.

For example, the feature in which the bonding state of the bonded portion of the battery cell and the wire is the normal connection-confirmed state represents that the bonded portion has a strong magnetic field intensity. In this case, the bonding state of the bonded portion is finally determined as the normal connection state regardless of the thermal image reading result.

Also, when the bonding state of the bonded portion of the battery cell and the wire is the normal connection-considered state or the abnormal connection-considered state by comparing the thermal image reading result information with the magnetic field image reading result information, the bonding state of the bonded portion may be finally determined as the abnormal broken state.

That is, when the bonded portion of the battery cell and the wire is completely broken, the bonding state may not be confirmed by only the temperature difference or only the magnetic field image.

For example, a completely broken bonded portion and a normally connected bonded portion may not generate heat or may generate a small amount of heat, and since temperatures thereof may be greatly affected, the two portions may not be distinguished in terms of the temperature.

Also, since each of a damaged bonded portion and a completely broken bonded portion has a small magnetic field intensity, the two portions may not be distinguished in terms of the magnetic field intensity.

However, in accordance with an exemplary embodiment, the bonding state of the bonded portion may be exactly finally determined as the abnormal broken state by comparing the thermal image reading result information with the magnetic field image reading result information to check the bonding state of the bonded portion of the battery cell and the wire is included in all of the normal connection-considered state and the abnormal state-considered state, i.e., by cross-validating the bonding state in terms of the thermal state and the magnetic field intensity.

Although the embodiments of the present invention have been described, it is understood that the present invention should not be limited to these embodiments. Thus, the preferred embodiments should be considered in descriptive sense only and not for purposes of limitation, and also the technical scope of the invention is not limited to the embodiments. Therefore, it will be readily understood by those skilled in the art that various modifications and changes can be made thereto without departing from the spirit and scope of the present invention defined by the appended claims.

DESCRIPTION OF THE REFERENCE SIGNS

10: Battery pack housing
20: Battery cell holder
30: Battery cell
40: Bus bar
50: Support part
60: Thermal image photographing unit
70: Magnetic field image photographing unit
80: Diagnosis part
H: Hole
W: Wire
DB1: Photographed thermal image data
DB2: Photographed magnetic field image data
P1: Photographed thermal image
P2: Photographed magnetic field image

What is claimed is:

1. A battery pack diagnosis method comprising:
a battery pack manufacturing process of manufacturing a battery pack by bonding-connecting a battery cell and a wire;
a battery cell charging and discharging process of charging and discharging the battery cell through the wire;
a battery pack thermal image photographing process of photographing a thermal image of the battery pack;
a thermal image reading process of reading a bonding state of a bonded portion of the battery cell and the wire from photographed thermal image data of the thermal image;
a battery pack magnetic field image photographing process of photographing a magnetic field image of the battery pack;
a magnetic field image reading process of reading the bonding state of the bonded portion of the battery cell and the wire from photographed magnetic field image data of the magnetic field image; and
a wire bonding state defect determining process of finally determining the bonding state of the battery cell and the wire by combining thermal image reading result information obtained in the thermal image reading process and magnetic field image reading result information obtained in the magnetic field image reading process.

2. The battery pack diagnosis method of claim 1, wherein the battery pack thermal image photographing process generates the photographed thermal image by photographing a predetermined plane on which the wire is positioned, and
wherein the photographed thermal image has a predetermined pixel size less than at least one of a thickness of the wire and a size of a bonded portion of the wire.

3. The battery pack diagnosis method of claim 2, wherein the battery pack magnetic field image photographing process generates the magnetic field image by photographing the same predetermined plane as that photographed to obtain the photographed thermal image, and
wherein the photographed magnetic field image has a predetermined pixel size determined in correspondence to that of the photographed thermal image.

4. The battery pack diagnosis method of claim 1, wherein the thermal image reading process comprises:
a thermal image contour generating process of extracting a predetermined contour in the photographed thermal image and generating a shape of the bonded portion of the battery cell and the wire;
a bonded portion temperature reading process of reading a temperature of the bonded portion of the battery cell and the wire from the photographed thermal image data as one of a high temperature and a low temperature;
a bonded portion abnormal connection determining process of determining the bonding state of the bonded portion of the battery cell and the wire as an abnormal connection-confirmed state when the bonded portion of the battery cell and the wire has a temperature greater than a predetermined reference temperature;
a bonded portion normal connection-considered determining process of determining the bonding state of the bonded portion of the battery cell and the wire as a normal connection-considered state when the bonded portion of the battery cell and the wire has a temperature less than the reference temperature; and
a thermal image reading result information generating process of generating the thermal image reading result information by matching position information of the bonded portion of the battery cell and the wire with the bonding state of the bonded portion of the battery cell and the wire.

5. The battery pack diagnosis method of claim 4, wherein the magnetic field image reading process comprises:
a magnetic field image contour generating process of generating a shape of the bonded portion of the battery cell and the wire in the photographed magnetic field image by using the contour extracted from the thermal image reading process;
a bonded portion magnetic field intensity reading process of reading a magnetic field intensity of the bonded portion of the battery cell and the wire from the photographed magnetic field image data;
a bonded portion normal connection determining process of determining the bonding state of the bonded portion of the battery cell and the wire as a normal connection-confirmed state when the bonded portion of the battery cell and the wire has the magnetic field intensity greater than a predetermined reference intensity;
a bonded portion abnormal connection-considered determining process of determining the bonding state of the bonded portion of the battery cell and the wire as an abnormal connection-considered state when the bonded portion of the battery cell and the wire has the magnetic field intensity less than the reference intensity; and
a magnetic field image reading result information generating process of generating magnetic field image reading result information by matching position information of the bonded portion of the battery cell and the wire with the bonding state of the bonded portion of the battery cell and the wire.

6. The battery pack diagnosis method of claim 5, wherein the wire bonding state defect determining process finally determines the bonding state of the bonded portion of the battery cell and the wire as one state selected from a normal connection state, an abnormal connection state, and an abnormal broken state by comparing the thermal image reading result information with the magnetic field image reading result information.

7. The battery pack diagnosis method of claim 6, wherein the wire bonding state defect determining process, by comparing the thermal image reading result information with the magnetic image reading result information, finally determines:
- the bonding state of the bonded portion of the battery cell and the wire as the abnormal connection state when the bonding state of the bonded portion of the battery cell and the wire is an abnormal connection-confirmed state;
- the bonding state of the bonded portion of the battery cell and the wire as the normal connection state when the bonding state of the bonded portion of the battery cell and the wire is a normal connection-confirmed state; and
- the bonding state of the bonded portion of the battery cell and the wire as the abnormal broken state when the bonding state of the bonded portion of the battery cell and the wire is a normal connection-considered state or an abnormal connection-considered state.

8. The battery pack diagnosis method of claim 1, wherein while the battery cell charging and discharging process is performed, the battery pack thermal image photographing process and the battery pack magnetic field image photographing process are simultaneously performed.

9. The battery pack diagnosis method of claim 1, wherein while the battery cell charging and discharging process is performed, the battery pack thermal image photographing process and the battery pack magnetic field image photographing process are performed in a predetermined order with a predetermined time difference.

10. A battery pack upon which the battery pack diagnosis method of claim 1 is performed, the battery pack comprising:
- the battery cell; and
- the wire connected to the battery cell.

* * * * *